United States Patent
Li et al.

(10) Patent No.: US 11,355,720 B2
(45) Date of Patent: Jun. 7, 2022

(54) HIGH EFFICIENCY LARGE AREA PEROVSKITE SOLAR CELLS AND PROCESS FOR PRODUCING THE SAME

(71) Applicant: Ecole Polytechnique Federale de Lausanne (EPFL), Lausanne (CH)

(72) Inventors: Xiong Li, Wuhan (CN); Chenyi Yi, Beijing (CN); Dongqin Bi, Guangzhou (CN); Shaik Mohammed Zakeeruddin, Bussigny-Lausanne (CH); Michael Graetzel, St-Sulpice (CH); Anders Hagfeldt, Lully (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 16/085,756

(22) PCT Filed: Mar. 16, 2017

(86) PCT No.: PCT/IB2017/051538
§ 371 (c)(1),
(2) Date: Sep. 17, 2018

(87) PCT Pub. No.: WO2017/158551
PCT Pub. Date: Sep. 21, 2017

(65) Prior Publication Data
US 2019/0044080 A1 Feb. 7, 2019

(30) Foreign Application Priority Data

Mar. 18, 2016 (EP) ..................................... 16161285
Mar. 24, 2016 (EP) ..................................... 16162412

(51) Int. Cl.
*H01L 51/44* (2006.01)
*H01L 51/00* (2006.01)
*H01L 51/42* (2006.01)

(52) U.S. Cl.
CPC ........ *H01L 51/447* (2013.01); *H01L 51/0003* (2013.01); *H01L 51/0026* (2013.01);
(Continued)

(58) Field of Classification Search
CPC ............... H01L 51/0026; H01L 51/447; H01L 51/0035; H01L 51/0003
See application file for complete search history.

(56) References Cited

U.S. PATENT DOCUMENTS

2015/0249170 A1* 9/2015 Snaith .................. H01L 51/4226
136/256
2016/0035917 A1* 2/2016 Gershon ................. H01L 31/18
438/93
(Continued)

FOREIGN PATENT DOCUMENTS

CN 104465992 A 3/2015
CN 104993054 A 10/2015
(Continued)

OTHER PUBLICATIONS

International Search Report; European Patent Office; International Application No. PCT/IB2017/051538; dated Oct. 9, 2017; 4 pages.
Written Opinion of the International Searching Authority; European Patent Office; International Application No. PCT/B2017/051538; dated Oct. 9, 2017; 8 pages.

*Primary Examiner* — Tuan A Hoang
(74) *Attorney, Agent, or Firm* — Taft Stettinius & Hollister LLP

(57) ABSTRACT

The present invention relates to a method for producing a solid state solar cell, including the steps of providing a conductive support layer or current collector, applying a metal oxide layer on the conducting support layer, applying at least one sensitizer layer onto the metal oxide layer or onto a first optional layer covering the metal oxide layer, the first optional layer including a charge transporting layer, applying a second optional layer onto the sensitizer layer, the
(Continued)

second optional layer being selected from a charge transporting layer, a protective layer, or a combination of both layers, and providing a counter electrode or a metal electrode onto the sensitizer layer or the second optional layer. The at least one sensitizer layer includes an organic-inorganic or metal halide perovskite and is treated by the application of a vacuum before the annealing of the sensitizer.

7 Claims, 6 Drawing Sheets

(52) U.S. Cl.
CPC ...... *H01L 51/0032* (2013.01); *H01L 51/4226* (2013.01); *Y02E 10/549* (2013.01)

(56) References Cited

U.S. PATENT DOCUMENTS

| | | |
|---|---|---|
| 2016/0049585 A1 | 2/2016 | Lin et al. |
| 2016/0254472 A1* | 9/2016 | Wang .................. C23C 14/5846 |
| | | 136/263 |
| 2016/0380125 A1* | 12/2016 | Snaith ............... H01L 31/02167 |
| | | 136/256 |
| 2018/0006254 A1* | 1/2018 | Mohite ................. H01L 51/004 |

FOREIGN PATENT DOCUMENTS

| | | |
|---|---|---|
| EP | 3136450 A1 | 3/2017 |
| KR | 20150124413 A | 11/2015 |
| WO | 2014045021 A1 | 3/2014 |
| WO | 2015092397 A1 | 6/2015 |

* cited by examiner

HIGH EFFICIENCY LARGE AREA PEROVSKITE SOLAR CELLS AND PROCESS FOR PRODUCING THE SAME

CROSS REFERENCE TO RELATED APPLICATIONS

This application is a U.S. national stage filing of International Patent Application No. PCT/IB2017/051538 filed Mar. 16, 2017, which claims priority to European Patent Application No. 16161285.8 filed Mar. 18, 2016 and to European Patent Application No. 16162412.7 filed Mar. 24, 2016, the contents of each application hereby incorporated by reference in their entirety.

TECHNICAL FIELD

The present invention relates to high efficiency large area perovskite solar cells, to organic-inorganic perovskite based photoelectric conversion devices having high quality organic-inorganic perovskite film of large area ($>1$ cm$^2$), to high quality organic-inorganic perovskite films of large area, to methods for producing the same, in particular to vacuum-flash assisted solution process for producing the same.

PRIOR ART AND THE PROBLEM UNDERLYING THE INVENTION

The conversion of solar energy to electrical current using thin film third generation photovoltaics (PV) is being widely explored for the last two decades. The sandwich/monolithic-type PV devices, consisting of a mesoporous photoanode with an organic/inorganic light harvester, redox electrolyte/solid-state hole conductor, and counter electrode, have gained significant interest due to the ease of fabrication, flexibility in the selection of materials and cost effective. Further the organometallic halide perovskite based on tin ($CsSnX_3$) or lead ($CH_3NH_3PbX_3$) have been introduced in the place of traditional metal-organic complex or organic molecules as the light harvester. Organic-inorganic hybrid lead halide or metal halide perovskite photovoltaics presently attract enormous research interest due to their low cost of fabrication and materials and high solar to electric power conversion efficiency (PCE). Over the past five years the PCE of the perovskite solar cells (PSCs) raises steeply from about 3% to 22.0%; which is unprecedented in the field of photovoltaics.

WO 2014/020499A1 discloses a solid-state solar cell comprising a conducting support layer, a surface-increasing scaffold structure, one or more organic-inorganic perovskite layers provided on the scaffold structure and a counter electrode. In the solar cells reported in this reference, remarkable conversion efficiencies were achieved in absence of organic hole transport material or a liquid electrolyte, which rendered the latter optional. The optimal protocol for the deposition of $CH_3NH_3PbX_3$ on $TiO_2$ is achieved by the spin-coating of the precursor ($CH_3NH_3X$ and $PbX_2$, X=Cl, Br, I) solution on the mesoporous $TiO_2$ film, followed by low temperature annealing step. The annealing process results in a crystalline $CH_3NH_3PbX_3$. From experience, the morphology of the perovskite crystals formed during this kind of solution processing cannot be well controlled and is one of the reasons for the poor reproducibility of PV cell performance.

Despite the remarkable progress in perovskite synthesis, most of the researches were done by using small-area ($<0.2$ cm$^{-2}$) perovskite, there have been only a few studies attempting to fabricate large-area PSCs. The best certified PSC of a cell with a size exceeding the critical threshold of 1 cm$^2$, qualifying for entry in the official solar efficiency tables, is 15.6%. This lags far behind the 22% reached with a small laboratory cell. This reflects severe problems to maintain top-level efficiencies upon scaling up the size of PSCs with the current preparation methods of perovskite films. This also reflects the great difficulty to produce homogeneous, high quality perovskite films of large area with the currently applied deposition procedures including the anti-solvent precipitation method that has so far given the highest efficiency for small laboratory cells.

To control the morphology of the perovskite films to provide enhanced stability and reproducibility of the devices remains challenging. One attempt to improve the quality of perovskite film by minimizing the pore formation consists of using a method of vacuum assisted thermal annealing (vacuum application during annealing step) to remove byproduct (methylammonium chloride: MACl) completely during the formation of methylammonium lead halide perovskite (Fengxian Xie et al. Proc. SPIE 9567, Organic Photovoltaics XVI, 95670L (Sep. 9, 2015); doi:10.1117/12.2187973). Although such a pore-free and smooth perovskite film may provide a good efficiency and stability to a solar cell, the value of PCE of such a solar cell (14.5%) is considered to be still low. Further there is no control on the crystallization of the perovskite precursor, on the formation of perovskite grains and on the optimization of crystal orientation.

The present invention addresses disadvantages of devices comprising liquid electrolytes, such as the problem of solvent evaporation and the penetration of water into the solar cell caused by difficulty in long-term sealing especially in temperature cyclic tests.

The present invention addresses the problem to scale up the production of high efficiency small laboratory cell to the production of larger area perovskite solar cells keeping their high efficiency.

The present invention addresses the problem of the lack of reliable procedure for preparing large area PSCs and keeping their efficiency for larger area.

The present invention addresses the disadvantages of the vacuum methods for depositing the perovskite film from solution, and for removing reaction products, such as methylammonium chloride, during the thermal annealing of the film.

The present invention addresses the disadvantages of the other methods for producing perovskite films, which are not versatile, use anti-solvents method and cannot be adaptable for preparing larger scale PSCs.

The present invention addresses the problem of the presence of hysteresis in the J-V (current-voltage) curves in PSCs of small size.

The present invention addresses the problems depicted above.

SUMMARY OF THE INVENTION

Remarkably, in some aspects, the present inventors have found that, during the preparation of sensitizer film onto a substrate comprising a conductive support layer and a metal oxide layer, the application of a vacuum drying step after the deposition of the sensitizer layer and before the annealing of the sensitizer enables the inventors to fabricate solid state solar cell, comprising an organic-inorganic perovskite with aperture area larger than 1 cm$^2$ and with a certified PCE of 19.6%. Thus the method of the invention provides a procedure for preparing larger scale PSCs by avoiding the use of anti-solvents.

The present invention provides a method for producing a solid state solar cell, in particular for producing a solid state solar cell comprising an organic-inorganic perovskite or organic-inorganic perovskite film and/or layer treated by vacuum after its deposition onto the metal oxide layer or onto an optional layer covering the metal oxide layer and before the annealing of the sensitizer layer comprising the organic-inorganic perovskite.

The method of the invention allows boosting perovskite nucleation by rapid solvent removal. This creates a burst of nuclei for crystallization of perovskite and avoids pinhole formation by preventing the film from de-wetting. Thus the method of the invention allows to fabricate solid state solar cell of area lager than 1 cm$^2$ attaining a PCE comparable to today's best CdTe and CIGS thin film photovoltaics of similar size and showing virtually no hysteresis. Furthermore the reproducibility of the method of the invention is excellent.

In an aspect, the invention provides a method for producing a solid state solar cell comprising the steps of providing a conductive support layer or current collector; applying a metal oxide layer on the conductive support layer; applying at least one sensitizer layer comprising an organic-inorganic perovskite or a metal halide perovskite onto the metal oxide layer; and providing a counter electrode or a metal electrode onto the sensitizer layer; characterized in that the step of applying at least one sensitizer layer comprises providing the organic-inorganic perovskite or a metal halide perovskite under a film of one perovskite pigment or mixed perovskite pigments or of one or more perovskite pigments with mixed cations and anions; applying a vacuum to the organic-inorganic perovskite film or metal halide perovskite film deposited onto the preceding layer being metal oxide; annealing the organic-inorganic perovskite film or metal halide perovskite film having been treated by vacuum.

In another aspect, the invention provides a solid state solar cell comprising a conductive support layer or current collector, a metal oxide layer, a sensitizer layer, and a counter electrode or metal electrode, wherein the metal oxide layer covers the conductive support layer or current collector; the at least one sensitizer layer is in contact with the metal oxide layer; and the counter electrode or the metal electrode covers the at least one sensitized layer; characterized in that the at least, one sensitizer layer comprises a homogenous pinhole-free organic-inorganic perovskite or metal halide perovskite film, which fully covers the metal oxide layer and forms with the metal oxide layer a continuous metal oxide layer/organic-inorganic perovskite nano-composite being covered by a compact organic-inorganic perovskite capping layer, and having a thickness from 400 to 800 nm.

In an aspect, the invention provides a method for producing a solid state solar cell comprising the steps of:
providing a conductive support layer or current collector;
applying a metal oxide layer on the conductive support layer;
applying at least one sensitizer layer onto the metal oxide layer or onto a first optional layer covering the metal oxide layer, said first optional layer comprising a charge transporting layer;
applying a second optional layer onto the sensitizer layer, said second optional layer being selected from a charge transporting layer, a protective layer, or a combination of both layers; and
providing a counter electrode or a metal electrode onto the sensitizer layer or the second optional layer;
characterized in that the at least one sensitizer layer comprises an organic-inorganic perovskite or a metal halide perovskite and is treated by the application of a vacuum before the annealing of the sensitizer layer.

In a further aspect, the invention provides a solid state solar cell comprising a conductive support layer or current collector, a metal oxide layer, a first optional layer comprising a charge transporting layer, a sensitizer layer, a second optional layer being selected from a charge transporting layer, a protective layer, or a combination of both layers and a counter electrode or metal electrode,
wherein
the metal oxide layer covers the conductive support layer or current collector and is optionally covered by the first optional layer;
the at least one sensitizer layer is in contact with the metal oxide layer or the first optional layer and is covered optionally by the second optional layer,
the counter electrode or the metal electrode covers the at least one sensitized layer or the second optional layer; and
characterized in that the at least one sensitizer layer comprises an organic-inorganic perovskite or a metal halide perovskite and is treated by the application of a vacuum before the annealing of the sensitizer layer.

Further aspects and preferred embodiments of the invention are detailed herein below and in the appended and dependent claims. Further features and advantages of the invention will become apparent to the skilled person from the description of the preferred embodiments given below.

BRIEF DESCRIPTION OF THE DRAWINGS

FIG. 4a and FIG. 4b shows UV-vis spectra and steady state PL emission spectra of the perovskite films (FIG. 4a) and time resolved PL decay (FIG. 4b).

FIG. 5a shows schematic illustration of the perovskite solar cell configuration, where a smooth and compact perovskite capping layer fully covers the mesoporous TiO$_2$ layer (mp-TiO$_2$). FTO, fluorine-doped tin oxide; bl-TiO$_2$, TiO$_2$ compact layer. FIG. 5b shows a high-resolution cross sectional SEM image of a complete solar cell.

FIG. 6a) PV metrics for 20 devices fabricated by the CP (Conventional process) or VASP methods. FIG. 6b) Current-voltage (J-V) curves for the best performing devices using perovskite films prepared by the CP (black curve/bottom curve) and VASP (red curve/top curve) method measured under standard AM 1.5 solar radiation. FIG. 6c) Solid line: IPCE curves of cells fabricated by the CP (black curve/bottom curve) and VASP (red curve/top curve) method. Measurements were taken with chopped monochromatic light under a white light bias corresponding to 5% solar intensity. Dashed lines: short circuit photocurrent densities calculated from the overlap integral of the IPCE spectra with the standard AM 1.5 solar emission FIG. 6d) J-V curves for the best cell using VASP method recorded at a scanning rate of 50 mV s$^{-1}$ scanning in reverse (from $V_{oc}$ to $J_{sc}$) (light curve) and forward (from $J_{sc}$ to $V_{oc}$) (dark curve) scanning directions. The photovoltaic metrics derived from the two current-voltage curves as well are shown in the inset. FIG. 6e) Stabilized electric power output and the photocurrent density at maximum power point as a function of time for the same best cell as shown in d) under simulated one-sun illumination.

DETAILED DESCRIPTION OF THE PREFERRED EMBODIMENTS

Figure 1:
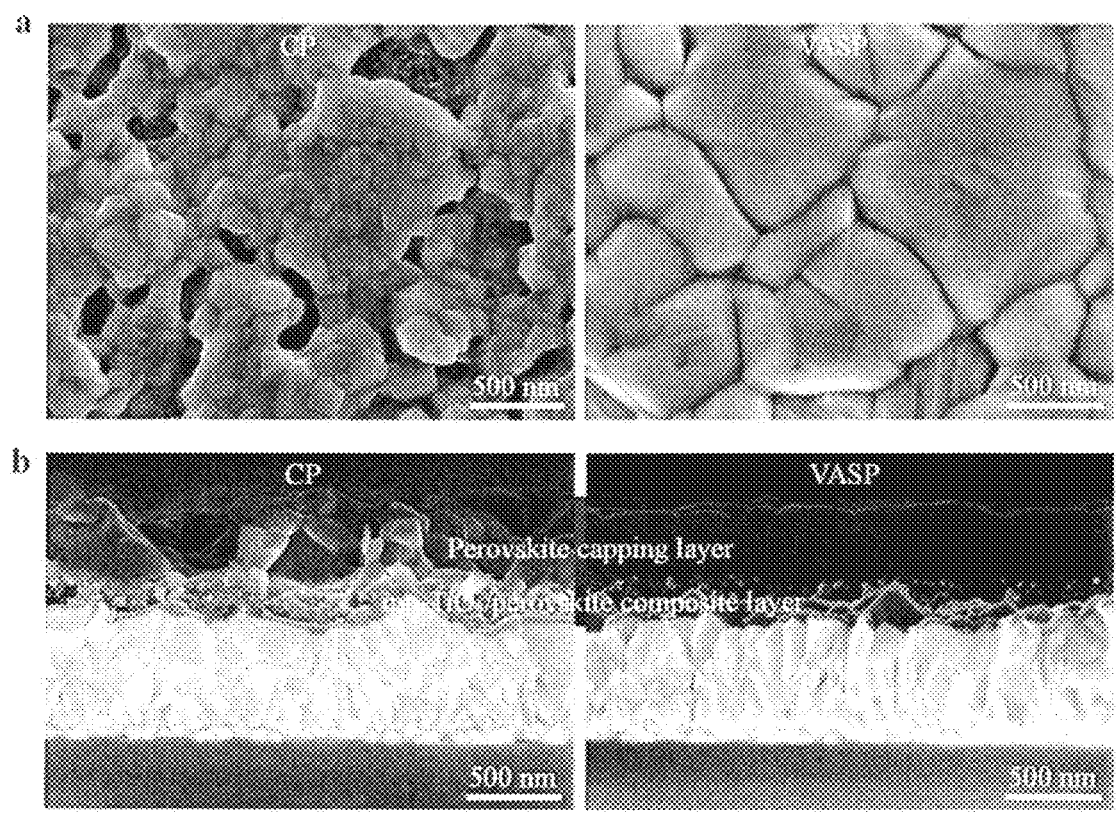
FIG. 1 shows scanning electron microscopy top view images (FIG. 1a) and cross sectional images (FIG. 1b) revealing drastic differences between the (FA$_{0.85}$MA$_{0.15}$)$_{0.95}$Pb(I$_{0.85}$Br$_{0.15}$) perovskite films with vacuum assisted solution process (VASP) and without said process (CP).

The present invention provides a method for producing a solid state solar cell, in particular for producing a solid state solar cell comprising an organic-inorganic perovskite film and/or layer treated by vacuum afters its deposition and before its annealing.

The method for producing a solid state solar cell comprises the steps of:
- providing a conductive support layer or current collector;
- applying a metal oxide layer on the conductive support layer;
- applying at least one sensitizer layer onto the metal oxide layer or onto a first optional layer covering the metal oxide layer, said first optional layer comprising a charge transporting layer;
- applying a second optional layer onto the sensitizer layer, said second optional layer being selected from a charge transporting layer, a protective layer, or a combination of both layers; and
- providing a counter electrode or a metal electrode onto the sensitizer layer or the second optional layer;
characterized in that the at least one sensitizer layer comprises an organic-inorganic perovskite or a metal halide perovskite and is treated by the application of a vacuum before the annealing of the sensitizer.

According to an embodiment, the method of the invention provides a sensitizer layer comprising, consisting of an organic-inorganic perovskite or a metal halide perovskite. Said organic-inorganic perovskite or a metal halide perovskite is provided under a film of one perovskite pigment or mixed perovskite pigments or one or more perovskite pigments with mixed cations and anions. Said organic-inorganic perovskite or a metal halide perovskite forms a film, which may consist of one or more layer of one or more identical of different organic-inorganic perovskite pigments or metal halide perovskite pigments. Said organic-inorganic perovskite or metal halide perovskite, or organic-inorganic perovskite film or metal halide perovskite film is treated after its deposition by the application of a vacuum, which may be performed in a vacuum chamber. This step allows rapidly removing the solvent. The organic-inorganic perovskite film or the metal halide perovskite film is then processed to be annealed.

Without to be bound by the theory, during the first step of the application of the sensitizer layer, namely providing organic-inorganic perovskite or a metal halide perovskite under a film of one perovskite pigment or mixed perovskite pigments or one or more perovskite pigments with mixed cations and anions, perovskite precursors in solution comprising solvents are applied. During the second step of the application of the sensitizer layer, a vacuum treatment is applied to the deposited film of perovskite precursors to remove the solvents in a controlled manner and to boost a rapid crystallization of a fibrous material comprising a Lewis-acid-base-type adducts representing perovskite intermediates with layer structure. Upon subsequent annealing in the third step of the application of the sensitizer layer, the fibrous perovskite intermediate rearranged and coalesced via the Ostwald ripening process to minimize surface energy on the release of the weak base present in the perovskite intermediates, leading to a homogenous film or coating of sensitizer, namely organic-inorganic perovskite or metal halide perovskite with large grains and optimized crystal orientation.

The term "perovskite", for the purpose of this specification, refers to the "perovskite structure" and not specifically to the perovskite material, CaTiO$_3$. For the purpose of this specification, "perovskite" encompasses and preferably relates to any material that has the same type of crystal structure as calcium titanium oxide and of materials in which the bivalent cation is replaced by two separate monovalent cations. The perovskite structure has the general stoichiometry AMX$_3$, where "A" and "M" are cations and "X" is an anion. The "A" and "M" cations can have a variety of charges and in the original Perovskite mineral (CaTiO$_3$), the A cation is divalent and the M cation is tetravalent. For the purpose of this invention, the perovskite formulae includes structures having three or four anions, which may be the same or different, and/or one or two organic cations, and/or metal atoms carrying two or three positive charges, in accordance with the formulae presented elsewhere in this specification.

The at least one sensitizer layer or the sensitizer may comprise one or more layers of an organic-inorganic perovskite or a metal halide perovskite. In said device, the last upper layer of organic-inorganic perovskite or metal halide perovskite is coated by the second optional layer comprising a charge transport material. Preferably said charge transport material is a hole transport material.

In an embodiment, the sensitizer layer comprises an organic-inorganic perovskite or a metal halide perovskite according to any one of perovskite-structures of formulae (I), (Ia), (Ib), (Ic), (Id), (Ie), (If) and/or (Ig) below:

$$AA'MX_4 \tag{I}$$

$$AMX_3 \tag{Ia}$$

$$AA'N_{2/3}X_4 \tag{Ib}$$

$$AN_{2/3}X_3 \tag{Ic}$$

$$BN_{2/3}X_4 \tag{Id}$$

$$BMX_4 \tag{Ie}$$

$$AA'A_1MX_3 \tag{If}$$

$$AA_1MX_3 \tag{Ig}$$

wherein,
A and A' are organic, monovalent cations being independently selected from primary, secondary, tertiary or quaternary organic ammonium compounds, including N-containing heterorings and ring systems, A and A' having independently from 1 to 60 carbons and 1 to 20 heteroatoms;

$A_1$ is an inorganic cation selected from $Cs^+$, $Rb^+$, $K^+$, preferably $Cs^+$;

B is an organic, bivalent cation selected from primary, secondary, tertiary or quaternary organic ammonium compounds having from 1 to 60 carbons and 2-20 heteroatoms and having two positively charged nitrogen atoms;

M is selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$, $[Sn_iPb_{(1-i)}]^+$, $[Sn_jGe_{(1-j)}]^+$, and $[Pb_kGe_{(1-k)}]^+$, i, j and k being a number between 0.0 and 1.0;

N is selected from the group of $Bi^{3+}$ and $Sb^{3+}$; and,

X are independently selected from $Cl^-$, $Br^-$, $I^-$, $NCS^-$, $CN^-$, $NCO^-$, from $[I_{(3-m)}Cl_m]^-$, $[I_{(3-n)}Br_n]^-$, $[Br_{(3-u)}Cl_u]^-$, m, n u being a number between 0.0 and 3.0, and from a combination of two anions selected from $Cl^-$, $Br^-$, $I^-$.

In particular, the three or four X may be identical or different. For example, in $AMX_3$ (formula Ia) may be expressed as formula (Ia') below:

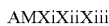   (Ia')

wherein Xi, Xii, Xiii are independently selected from $Cl^-$, $Br^-$, $I^-$, $NCS^-$, $CN^-$, $NCO^-$, from $[I_{(3-m)}Cl_m]^-$, $[I_{(3-n)}Br_n]^-$, $[Br_{(3-u)}Cl_u]^-$, m, n u being a number between 0.0 and 3.0, and from a combination of two anion selected from $Cl^-$, $Br^-$, $I^-$, preferably from halide ($Cl^-$, $Br^-$, $I^-$) and A and M are as defined elsewhere in this specification. Xi, Xii, Xiii may thus be the same or different in this case.

Preferably, if Xi, Xii, Xiii in formulae (Ia) and (Ic) or Xi, Xii, Xiii, Xiv in formulae (I), (Ib), (Id) or (Ie) comprise different anions X, there are not more than two different anions. For example, Xi and Xii being the same with Xiii being an anion that is different from Xi and Xii.

According to perovskite-structure of formula (If) or (Ig), A and A' are independently selected from methylammonium cation, formamidinium cations, iodo-carbamimidoyl cation or a combination of said cations.

According to a preferred embodiment, said organic-inorganic perovskite or metal halide perovskite layer comprises a perovskite-structure according to any one of the formulae (Ih) to (Im):

   (Ih)

   (Ii)

   (Ij)

   (Ik)

   (IIj)

   (Il)

   (Im)

wherein A, A', B and X are as defined above in this specification. Preferably, X is preferably selected from $Cl^-$, $Br^-$, and $I^-$, most preferably X is $I^-$ or a mixture of $Br^-$ and $I^-$.

The at least one sensitizer layer comprising organic-inorganic perovskite or metal halide perovskite may comprise a perovskite-structure according to any of the formulae (Ih) to (Im), more preferably (Ih) and/or (Ii).

According to an embodiment, A and A' are monovalent cations selected independently from any one of the compounds of formulae (20) to (28) below:

   (20)

   (21)

   (22)

   (23)

   (24)

   (25)

   (26)

   (27)

   (28)

wherein, $R_7$, $R_8$, $R_9$ and $R_{10}$ is independently selected from C1-C15 organic substituents comprising from 0 to 15 heteroatoms.

According to an embodiment of said C1-C15 organic substituent any one, several or all hydrogens in said substituent may be replaced by halogen and said organic substituent may comprise up to fifteen (15) N, S or O heteroatoms; and wherein, in any one of the compounds (20) to (28), the two or more of substituents present ($R_7$, $R_8$, $R_9$ and $R_{10}$, as applicable) may be covalently connected to each other to form a substituted or unsubstituted ring or ring system. Preferably, in a chain of atoms of said C1-C15 organic substituent, any heteroatom is connected to at least one carbon atom. Preferably, neighboring heteroatoms are absent and/or heteroatom-heteroatom bonds are absent in said C1-C15 organic substituent comprising from 0 to 15 heteroatoms. The heteroatoms may be selected from N, S, and/or O.

According to an embodiment, $R_7$, $R_8$, $R_9$ and $R_{10}$ are independently selected from C1 to C15 aliphatic and C4 to C15 aromatic or heteroaromatic substituents, wherein any one, several or all hydrogens in said substituent may be replaced by halogen and wherein, in any one of the compounds (20) to (28), the two or more of the substituents present may be covalently connected to each other to form a substituted or unsubstituted ring or ring system.

According to a preferred embodiment, the organic-inorganic perovskite is selected from a compound of formula (I), (Ia), (If) or (Ig).

According to an embodiment, B is a bivalent cation selected from any one of the compounds of formulae (49) and (50) below:

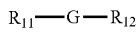
(29)

(30)

wherein, in the compound of formula (29), G is an organic linker structure having 1 to 10 carbons and 0 to 5 heteroatoms selected from N, S, and/or O, wherein one or more hydrogen atoms in said G may be replaced by halogen;

wherein $R_{11}$ and $R_{12}$ are independently selected from a compounds of any one of formulae (20) to (28); and wherein, in the compound of formula (30), the circle containing said two positively charged nitrogen atoms represents a substituted or unsubstituted aromatic ring or ring system comprising 4 to 15 carbon atoms and 2 to 7 heteroatoms or 4 to 10 carbon atoms and 2 to 5 heteroatoms, wherein said nitrogen atoms are ring heteroatoms of said ring or ring system, and wherein the remaining of said heteroatoms may be selected independently from N, O and S and wherein $R_{13}$ and $R_{14}$ are independently selected from H and from a compounds of any one of formulae (20) to (28). Halogen atom substituting hydrogen atom totally or partially may also be present in addition to and/or independently of said 2 to 7 heteroatoms.

Preferably, if the number of carbons is in G is impair, the number of heteroatoms is smaller than the number of carbons. Preferably, in the ring structure of formula (30), the number of ring heteroatoms is smaller than the number of carbon atoms. According to an embodiment, G is an aliphatic, aromatic or heteroaromatic linker structure having from 1 to 10 carbons.

According to an embodiment, $R_7$, $R_8$, $R_9$ and $R_{10}$ are independently selected from C1 to C10 alkyl, C2 to C10 alkenyl, C2 to C10 alkynyl, C4 to C10 heteroaryl and C6 to C10 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to C8 alkyl, C2 to C8 alkenyl, C2 to C8 alkynyl, C4 to C8 heteroaryl and C6 to C8 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to $C_6$ alkyl, C2 to C6 alkenyl, C2 to C6 alkynyl, C4 to C6 heteroaryl and C6 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to C4 alkyl, C2 to C4 alkenyl and C2 to C4 alkynyl, wherein said alkyl, alkenyl and alkynyl, if they comprise 3 or more carbons, may be linear, branched or cyclic, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to C3, preferably C1 to C2 alkyl, C2 to C3, preferably C2 alkenyl and C2 to C3, preferably C2 alkynyl, wherein said alkyl, alkenyl and alkynyl, if they comprise 3 or more carbons, may be linear, branched or cyclic, and wherein several or all hydrogens in $R_7$, $R_8$, $R_9$ and $R_{10}$ may be replaced by halogen.

According to an embodiment, $R_7$, $R_8$, $R_9$ and $R_{10}$ is independently selected from C1 to C4, more preferably C1 to C3 and even more preferably C1 to C2 alkyl. Most preferably $R_7$, $R_8$, $R_9$ and $R_{10}$ are methyl. Again, said alkyl may be completely or partially halogenated.

According to an embodiment, A, A' and B are monovalent (A, A') and bivalent (B) cations, respectively, selected from substituted and unsubstituted C5 to C6 rings comprising one, two or more nitrogen heteroatoms, wherein one (for A and A') or two (for B) of said nitrogen atoms is/are positively charged. Substituents of such rings may be selected from halogen and from C1 to C4 alkyls, C2 to C4 alkenyls and C2 to C4 alkynyls as defined above, preferably from C1 to C3 alkyls, C3 alkenyls and C3 alkynyls as defined above. Said ring may comprise further heteroatoms, which may be selected from O, N and S. Bivalent organic cations B comprising two positively charged ring N-atoms are exemplified, for example, by the compound of formula (30) above. Such rings may be aromatic or aliphatic.

A, A' and B may also comprise a ring system comprising two or more rings, at least one of which being from substituted and unsubstituted C5 to C6 ring as defined as above. The elliptically drawn circle in the compound of formulae (30) may also represent a ring system comprising, for example, two or more rings, but preferably two rings. Also if A and/or A' comprises two rings, further ring heteroatoms may be present, which are preferably not charged, for example.

According to an embodiment, however, the organic cations A, A' and B comprise one (for A, A'), two (for B) or more nitrogen atom(s) but are free of any O or S or any other heteroatom, with the exception of halogens, which may substitute one or more hydrogen atoms in cation A and/or B.

A and A' preferably comprise one positively charged nitrogen atom. B preferably comprises two positively charged nitrogen atoms.

A, A' and B may be selected from the exemplary rings or ring systems of formulae (31) and (32) (for A, A') and from (33) to (35) (for B) below:

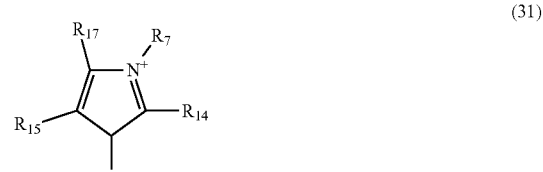
(31)

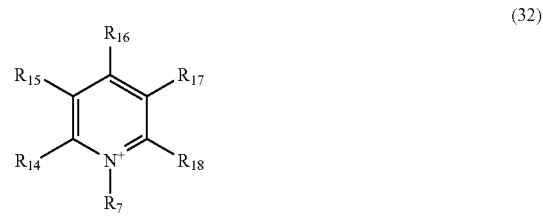
(32)

-continued

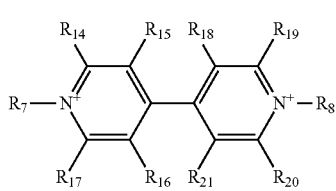

(33)

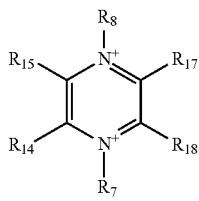

(34)

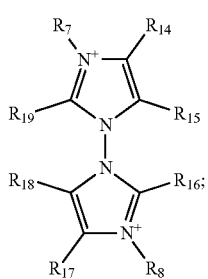

(35)

wherein $R_7$ and $R_8$ are selected from substituents as defined above, and $R_{14}$, $R_{15}$, $R_{16}$, $R_{17}$, $R_{18}$, $R_{19}$, $R_{20}$ and $R_{21}$ are independently selected from H, halogen and substituents as defined above for $R_7$, $R_8$, $R_9$ and $R_{10}$. Preferably, $R_{14}$, $R_{15}$, $R_{16}$, $R_{17}$, $R_{18}$, $R_{19}$, $R_{20}$ and $R_{21}$ are selected from H and halogen, most preferably H.

In the organic cations A, A' and B, hydrogen atoms may be substituted by halogens, such as F, Cl, I, and Br, preferably F or Cl. Such a substitution is expected to reduce the hygroscopic properties of the perovskite layer or layers and may thus provide a useful option for the purpose of the present specification.

According to a preferred embodiment, A and A' are independently selected from organic cations of formula (20) and/or formula (28).

According to a preferred embodiment, the metal M is selected from $Sn^{2+}$ and $Pb^{2+}$, preferably $Pb^{2+}$. According to a preferred embodiment, N is $Sb^{3+}$.

According to a preferred embodiment, the three or four X are independently selected from $Cl^-$, $Br^-$, and $I^-$.

According to an embodiment, the method of the invention provides a sensitizer layer having a thickness from 10 nm to 800 nm, 15 nm to 400 nm or 100 nm to 300 nm. The sensitizer layer has a thickness from 20 nm to 350 nm or 60 nm to 350 nm, preferably from 250 nm to 350 nm. Preferably the sensitizer layer comprises or consists of organic-inorganic perovskite has a thickness as defined above, namely from 10 nm to 800 nm, 15 nm to 400 nm, 100 nm to 300 nm, from 20 nm to 350 nm or from 60 nm to 350 nm, preferably from 250 nm to 350 nm.

According to a further embodiment, the method of the invention provides the treatment of the sensitizer layer by vacuum before the annealing of the sensitizer. The pressure of the vacuum is in the range from 1 to 30 Pa, 10 to 20 Pa, preferably at 20 Pa.

In another embodiment, the application of the vacuum lasts from 1 to 20 seconds, from 1 to 10 seconds, preferably 10 seconds.

The conductive support layer or current collector covered by the metal oxide layer, or the metal oxide layer covered by a first optional layer, if present, and further covered by the sensitizer layer comprising the organic-inorganic perovskite is placed in a vacuum chamber at the conditions defined above and then is heated for performing the annealing.

The step of providing the current collector or the conductive support layer and/or the step of applying the metal oxide are performed by a deposition method from a solution being selected from drop casting, spin-coating, dip-coating, curtain coating, spray-coating, and ink-jet printing, meniscus coating.

The current collector or the conductive layer has a thickness being ≤30 nm, ≤50 nm, ≤70 nm, ≤90 nm, or ≤110 nm, preferably ≤70 nm.

The annealing of the sensitizer layer treated by vacuum is performed at a temperature from 80° C. to 140° C., preferably at 100° C., for 5 to 70 minutes, preferably 10 to 60 minutes.

According to another embodiment of the method of the invention, the step of applying the sensitizer layer comprising the organic-inorganic perovskite is performed by a deposition method selected from drop casting, spin-coating, dip-coating, spray-coating and a combination of said deposition methods. Preferably the deposition method is spin-coating. The organic-inorganic perovskite precursor may be under the form of solution in a mixed solvents comprising DMSO and Dihydrofuran-2(3H)-one, and which may be applied by spin-coating.

The method of deposition from solution encompasses drop casting, spin-coating, dip-coating, curtain coating, spray-coating, and ink-jet printing methods. The sensitizer being an organic-inorganic perovskite may be also applied in one-step process, from any one of the methods of deposition from a solution, dispersion, a colloid, a crystal or a salt, if solution, dispersion, colloid, crystal or salt comprises said organic-inorganic perovskite. Further application methods of organic-inorganic perovskite are described in EP13166720.6.

According to an embodiment, the method of the invention further comprises applying a first layer comprising a charge transporting layer onto the metal oxide layer before applying the at least one sensitizer layer, said first layer being covered by the at least one sensitizer layer and being the preceding layer onto which the organic-inorganic perovskite film or metal halide perovskite film is deposited. This first layer is an optional layer, which is also defined as first optional layer in the present application.

According to a further embodiment, the at least one sensitizer layer or the sensitizer layer is applied directly on the metal oxide layer. No charge transporting layer is present between the metal oxide layer and the conductive support layer.

Charge transporting layer comprises charge transport material may be selected from hole transport material or electron transport material.

The first optional layer covering the metal oxide layer on the conductive support layer of current collector is an optional charge transporting layer comprising an electron charge transport material.

The electron transport material may be selected from [6,6]-phenyl-$C_{61}$-butyric acid methyl ester (PCBM), 1,4,5,8,9,11-hexazatriphenylene-hexacarbonitrile (HAT-CN), ($C_{60}$-$I_h$)[5,6]fullerene (C60), (C70-D5h)[5,6]fullerene (C70), [6,6]-Phenyl $C_{71}$ butyric acid methyl ester (PC70BM), 2,9-dimethyl-4,7-diphenyl-1,10-phenanthroline (BCP), 1,3,5-tri(phenyl-2-benzimi-dazolyl)-benzene (TPBI), preferably PCBM, HAT-CN, C60, C70, PC70BM, and metal oxide. The metal oxide is an oxide of a metal selected from a group of metal consisting of Ti, Sn, Cs, Fe, Zn, W, Nb, SrTi, Si, Ti, Al, Cr, Sn, Mg, Mn, Zr, Ni, and Cu.

In a further embodiment, the method of the invention comprise applying a second layer is applied onto the sensitizer layer, said second layer being selected from a charge transporting layer, a protective layer, or a combination of both layers, and the counter electrode or the metal electrode covering said second layer. This second layer is an optional layer, which is also defined as a second optional layer in the present application.

The charge transporting layer comprises an electron transport material has a thickness being ≤10 nm, ≤20 nm, ≤50 nm, preferably ≤10 nm.

According to another embodiment, the second optional layer is a charge transporting layer comprising a hole transport material.

In an embodiment of the method of the invention, the application or deposition of the second optional layer comprising a charge transport material being a hole transport material is performed by a deposition method from a solution selected from drop casting, spin-coating, dip-coating, curtain coating, spray-coating, and ink-jet printing, meniscus, preferably by meniscus coating. The solution to be applied may comprise one or more hole transport materials or two or more solutions may be mixed and applied either in a one-step process or in a two or more sequential steps process to form a film onto the sensitizer layer comprising or consisting of the organic-inorganic sensitizer.

According to a further aspect, the invention provides solid state solar cell comprising a conductive support layer or current collector, a metal oxide layer, a first optional layer comprising a charge transporting layer, a sensitizer layer, a second optional layer being selected from a charge transporting layer, a protective layer, or a combination of both layers and a counter electrode or metal electrode,
wherein
the metal oxide layer covers the conductive support layer or current collector and is optionally covered by the first optional layer;
the at least one sensitizer layer is in contact with the metal oxide layer or the first optional layer and is covered optionally by the second optional layer,
the counter electrode or the metal electrode covers the at least one sensitized layer or the second optional layer; and
characterized in that the at least one sensitizer layer comprises an organic-inorganic perovskite or a metal halide perovskite and is treated by the application of a vacuum before the annealing of the sensitizer layer.

As mentioned herein, the at least one sensitizer layer may be applied directly on the metal oxide layer, since said first layer is an optional layer.

In a further embodiment, the at least one sensitizer layer comprises a homogenous pinhole-free organic-inorganic perovskite or metal halide perovskite film, which fully covers the metal oxide layer and forms with the metal oxide layer a continuous metal oxide layer/organic-inorganic perovskite nano-composite being covered by a compact organic-inorganic perovskite capping layer, and having a thickness from 400 to 800 nm. The word "film" here qualifying the sensitizer (perovskite) obtained after the treatments of vacuum and annealing here means "coating" and has not to be confused with the perovskite pigments film provided before the treatments of vacuum and annealing.

According to an embodiment, the sensitizer layer comprises an organic-inorganic perovskite or a metal halide perovskite is applied according to any one of deposition methods selected from drop casting, spin-coating, dip-coating, spray-coating and a combination of said deposition methods. It may also be deposited by further methods as specified herein. The sensitizer layer may comprise one or more organic-inorganic perovskite pigments or metal halide perovskite pigments forming one or more layers. This constitutes the organic-inorganic perovskite film or metal halide perovskite film.

According to a further embodiment, the solid state solar cell of the invention comprises a second optional layer being a charge transporting layer, preferably a charge transporting layer comprising a hole transport material.

By "hole transport material", "hole transporting material", "organic hole transport material" and "inorganic hole transport material", and the like, is meant any material or composition wherein charges are transported by electron or hole movement (electronic motion) across said material or composition. The "hole transport material" is thus an electrically conductive material. Such hole transport materials, etc., are different from electrolytes. In this latter, charges are transported by diffusion of molecules.

Hole transport material may be preferably selected from organic and inorganic hole transport materials.

The skilled person is aware of a large variety of organic hole transport materials, such as the conducting polymers disclosed elsewhere in this specification. For example, in WO2007107961, a liquid and non-liquid organic hole conductor are disclosed, which may be used for the purpose of the present invention. Also in EP 1160888 and other publications organic hole transport materials ("organic electrically conducting agent") are disclosed.

According to an embodiment, the hole transport material is selected from triphenylamine, carbazole, N,N,(diphenyl)-N',N'di-(alkylphenyl)-4,4'-biphenyldiamine, (pTPDs), diphenylhydrazone, poly [N,N'-bis(4-butylphenyl)-N,N'-bis (phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9, 9'-spirobifluorene) (spiro-OMeTAD), N,N,N',N'-tetraphenylbenzidine (TPD).

Further ionic compounds may be present in organic hole transport materials, said ionic compounds being selected from $TBAPF_6$, Na $CF_3SO_3$, Li $CF_3SO_3$, $LiClO_4$ and $Li[(CF_3SO_2)_2N$. Other compounds that may be present in organic hole transport materials are amines, 4-tertbutylpyridine, 4-nonyl-pyridine, imidazole, N-methyl benzimidazole, for example.

Hole transport material may be also inorganic hole transport materials. A wide variety of inorganic hole transport materials is commercially available. Non-limiting examples of inorganic hole transport materials are $Cu_2O$, CuNCS, CuI, $MoO_3$, and $WO_3$.

The solid state solar cell may comprise a protective layer as being the second optional layer. This protective layer may be a metal oxide layer comprising a material selected from Mg-oxide, Hf-oxide, Ga-oxide, In-oxide, Nb-oxide, Ti-oxide, Ta-oxide, Y-oxide and Zr-oxide. This layer may have a thickness of not more than 1.5 nm, preferably not more than 1 nm. Said metal oxide layer is in particular "buffer layer, which reduces or prevents recombination of photo generated electrons with the perovskite material, for example.

According to a further embodiment the conductive support layer or current collector of the comprises a material selected from indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$ and zinc oxide.

The material is preferably coated on a transparent substrate, such as plastic or glass. In this case, the plastic or glass provides the support structure of the layer and the cited conducting material provides the conductivity. Such support layers are generally known as conductive glass and conductive plastic, respectively, which are thus preferred conducting support layers in accordance with the invention. The conductive support layer may comprise a conducting glass or a conducting plastic.

The current collector may also be provided by a conductive metal foil, such as titanium or zinc foil, for example. Non-transparent conductive materials may be used as current collectors in particular on the side of the device that is not exposed to the light to be captured by the device.

According to another embodiment, a metal oxide layer is applied on the conductive support layer. The metal oxide layer comprises a metal oxide selected from Si, TiO$_2$, SnO$_2$, Fe$_2$O$_3$, ZnO, WO$_3$, Nb$_2$O$_5$, CdS, ZnS, PbS, Bi$_2$S$_3$, CdSe, CdTe, SrTiO$_3$, GaP, InP, GaAs, CuInS$_2$, CuInSe$_2$. The metal oxide layer may form a scaffold structure increasing the surface of the conductive support layer.

In another embodiment, the solid state solar cell of the invention comprises a conductive layer, which covers the second optional layer comprising a charge transport material and comprises one or more conductive material selected from poly(3,4-ethylenedioxythiophene):poly(styrene-sulfonate) (PEDOT:PSS), poly(3,4-ethylenedioxythiophene):poly(styrenesulfonate):grapheme nanocomposite (PEDOT:PSS:graphene), poly(N-vinylcarbazole) (PVK) and sulfonated poly(diphenylamine) (SPDPA), preferably from PEDOT:PSS, PEDOT:PSS:graphene and PVK, more preferably from PEDOT:PSS. Conductive polymers may also be selected from polymers comprising polyaniline, polypyrrole, polythiophene, polybenzene, polyethylenedioxythiophene, polypropylenedioxy-thiophene, polyacetylene, and combinations of two or more of the aforementioned, for example. The conductive polymer of the invention is preferably selected from the above polymer in a watery dispersion The step of applying the conductive layer is performed by a deposition method from one or more solutions of one or more conductive materials, said method selected from drop casting, spin-coating, dip-coating, curtain coating, spray-coating, and ink-jet printing, preferably by spin-coating. The solution may comprise one or more conductive materials or two or more solutions may mixed and applied in a one-step process to form a film onto the hole collector or applied in a process comprising two or more sequential steps.

The step of applying the conductive layer is performed by a method selected from physical vapor deposition method group and/or from chemical vapor deposition as defined herein.

The solar cell of the invention preferably comprises a counter electrode. The counter electrode generally comprises a catalytically active material, suitable to provide electrons and/or fill holes towards the inside of the device. The counter electrode may thus comprise one or more materials selected from Pt, Au, Ni, Cu, Ag, In, Ru, Pd, Rh, Ir, Os, C, conductive polymer and a combination of two or more of the aforementioned.

In a further embodiment, the solid state solar cell has an aperture area >0.9 cm$^2$, preferably an aperture area ≥1.0 cm$^2$.

The current collector may comprise a catalytically active material, suitable to provide electrons and/or fill holes towards the inside of the device. The current collector may comprise a metal or a conductor or may be a metal layer or a conductor layer. The current collector may comprise one or more materials being metals selected from Pt, Au, Ni, Cu, Ag, In, Ru, Pd, Rh, Ir, Os, C or conductors selected from carbon nanotubes, graphene and grapheme oxides, conductive polymer and a combination of two or more of the aforementioned. Conductive polymers may be selected from polymers comprising polyaniline, polypyrrole, polythiophene, polybenzene, polyethylenedioxythiophene, polypropylenedioxythiophene, polyacetylene, and combinations of two or more of the aforementioned. Preferably the current collector comprises a metal selected from Pt, Au, Ni, Cu, Ag, In, Ru, Pd, Rh, Ir, Os, preferably Au. The current collector may comprise a conductor being transparent material selected from indium doped tin oxide (ITO), fluorine doped tin oxide (PTO), ZnO—Ga$_2$O$_3$, ZnO—Al$_2$O$_3$, tin oxide, antimony doped tin oxide (ATO), SrGeO$_3$ and zinc oxide.

The current collector is connected to the external circuit. With respect to the first side of the device, a conductive support such as conductive glass or plastic may be electrically connected to the counter electrode on the second side.

The present invention will now be illustrated by way of examples. These examples do not limit the scope of this invention, which is defined by the appended claims.

EXAMPLES

Example 1: Fabrication of a Solid State Solar Cell of the Invention and Photovoltaic Characterization Fabrication of the Solid State Solar Cell by Vacuum-Flash Assisted Solution Process (VASP)

A 30 nm TiO$_2$ blocking layer was deposited on the precleaned FTO (NSG) by spray pyrolysis using O$_2$ as the carrying gas at 450° C. from a precursor solution of 0.6 ml titanium diisopropoxide and 0.4 ml bis(acetylacetonate) in 7 ml anhydrous Isopropanol. A 150 nm mesoporous TiO$_2$ was coated on the substrate by spin-coating with a speed of 5000 rpm for 10 s with a ramp of 2000 rpm s$^{-1}$, from a diluted 30 nm particle paste (Dyesol) in Ethanol, the weight ratio of TiO$_2$ (Dyesol paste) and Ethanol is 6:1, and then the substrates was sintered at 500° C. for 20 min. The perovskite film was deposited by spin-coating onto the TiO$_2$ substrate. The [FAI$_{0.81}$(PbI$_2$)$_{0.85}$(MAPbBr$_3$)$_{0.15}$] precursor solution was prepared in glovebox from a 1.35M Pb$^{2+}$(PbI$_2$ and PbBr$_2$) in the mixed solvent of DMF, GBL and DMSO, the molar ratio of GBL/DMF is 1.1:1, and the molar ratio of Pb$^{2+}$/[(DMSO)$_{0.9}$ (thiourea)$_{0.1}$] is 1:1. The spin coating procedure was done in ambient air, first 1000 rpm for 28 s with a ramp of 200 rpm s$^{-1}$, second 4000 rpm for 18 s with a ramp of 2000 rpm s$^{-1}$.

For the vacuum treatment experiment, the substrate was put into a sample chamber connecting to gas pump system. By opening the valve connecting the specimen chamber and the low pressure system maintaining at 20 Pa for 10 s, immediately followed by full infiltration of ambient air into the specimen chamber.

And then, the substrate was put onto a hotplate for 1 hour at 100° C. After cooling down to room temperature, a hole transporting material of Spiro-OMeTAD was deposited on top by spin-coating. The spin coating procedure was done in an dry air flowing glovebox, first 1500 rpm for 10 s with a ramp of 200 rpm s$^{-1}$, second 4500 rpm for 30 s with a ramp of 2000 rpm s$^{-1}$. The Spiro-OMeTAD solutions were prepared dissolving the spiro-OMeTAD in chlorobenzene at a concentration of 65 mM, with the addition of 30 mM bis(trifluoromethanesulfonyl)imide from a stock solution in acetonitrile), 200 mM of tertbutylpyridine. Finally, 80 nm of gold was deposited by thermal evaporation using a shadow mask to pattern the electrodes.

Photovoltaic Characterisation

Current-voltage characteristics were recorded by applying an external potential bias to the cell while recording the generated photocurrent with a digital source meter (Keithley Model 2400). The light source was a 450-W xenon lamp (Oriel) equipped with a Schott K113 Tempax sunlight filter (Praezisions Glas & Optik GmbH) to match the emission spectrum of the lamp to the AM1.5G standard. Before each measurement, the exact light intensity was determined using a calibrated Si reference diode equipped with an infrared cut-off filter (KG-3, Schott). A mask of 1 cm2 was applied for measurement.

X-ray diffraction (XRD) spectra were recorded on an X'Pert MPD PRO (PANalytical) equipped with a ceramic tube radiation and a RTMS X'Celerator (PANalytical). The measurements were done in BRAGG-BRENTANO geometry. The samples were mounted without further modification and the automatic divergence slit (10 mm) and beam mask (10 mm) were adjusted to the dimension of the films. A step size of 0.008° was chosen for an acquisition time of 270.57 s deg$^{-1}$. A baseline correction Was applied to all X-Ray powder diffractograms to compensate for the broad feature arising from the FTO glass and anatase substrate.

Scanning electron microscope (SEM) images were recorded using a high-resolution scanning electron microscope (ZEISS Merlin).

Absorption spectra were measured on a PerkinElmer UV-Vis spectrophotometer. The absorbance was determined from a transmittance measurement using an integrating sphere. We used the "PerkinElmer Lambda 950 nm" set-up with the integrating sphere system "60 nm InGaAs integrating sphere" of the same company. The source are deuterium and tungsten halogen lamps and the signal is detected by a gridless photomultiplier with Peltier-controlled PbS detector. The UV WinLab software allows processing the data.

Atomic force microscope (AFM) was used to measure the surface roughness of 9 spots each 10×10 micrometer sized and distributed over a film surface of square-inch.

Photoluminescence (PL) and Time-Resolved Photoluminescence (TRPL) Experiments

PL spectra were recorded by exciting the perovskite samples deposited onto mesoporous TiO$_2$ at 460 nm with a standard 450 W Xenon CW lamp. The signal was recorded by a spectrofluorometer (Fluorolog, FL1065 from Horiba Jobin Yvon Technology) and analyzed by the software FluorEssence. The PL decay experiments were performed on the same samples with the same Fluorolog with a pulsed source at 406 nm (NanoLED 402-LH from Horiba, pulse width <200 ps, 11 pJ/pulse, approx. 1 mm$^2$ spot size) and the signal was recorded by the Time Correlated Single Photon Counting (TCSPC) technique. The samples were excited from the perovskite side under ambient conditions.

Example 2: Organic-Inorganic Based Solar Cell of the Invention

Herein, we demonstrate a simple and effective method to produce high quality perovskite films for large-area PSCs by applying for the first time a vacuum-flash step during the deposition of the perovskite film from solution in order to boost nucleation by rapid solvent removal. This differs from previous studies that employed vacuum methods to deposit the perovskite films or remove reaction products, i.e. methylammonium chloride by sublimation during the thermal annealing of the films. By using this method, a certified PCE of 19.6% for a 1 cm$^2$ device is achieved.

The method VASP also allows eliminating the hysteresis in the J-V curves, a notorious problem with PSCs.

The exemplified solid state solar cells of the invention comprise formamidinium (FA) and methylammonium (MA) mixed cation/mixed anion perovskites of the composition [FA$_{0.85}$MA$_{(015)}$PbI$_{0.85}$Br$_{0.15}$]. The method of the invention is also enabled for solid state solar cell comprising cesium (Cs) mixed perovskite [FA$_x$Cs$_{(1-x)}$PbX$_3$] formulations.

The method of the invention (VASP) is readily scalable to the industrial level. It provides a new bench mark for pushing the perovskite solar cells towards practical applications on a large scale.

The main fabrication steps of the perovskite film by VASP method (method of the invention) are the following:

the perovskite precursor solution is first spin-coated on top of a mesoporous TiO$_2$ film which is prepared as described in the literature (Burschka, J. et al. Sequential deposition as a route to high-performance perovskite-sensitized solar cells. Nature 499, 316 (2013)). Subsequently the film is placed for a few seconds into a vacuum chamber to boost perovskite nucleation by removing most of the residue solvent. The color of the film darkened slightly during the short vacuum treatment. Next, it is annealed at 100° C. for 10 minutes to yield a smooth, shiny and highly crystalline perovskite film. Thereafter, we spin coat a hole transporting layer (HTL) onto the perovskite film. We use 2,29,7,79-tetrakis(N,N-di-pmethoxyphenylamine)-9,9-spirobifluorene (spiro-OMeTAD) containing tert-butyl-pyridine (t-BP) and lithium bis(trifluoromethylsulphonyl)imide (Li TFSI) as additive. Finally, a thin layer of 80 nm gold is evaporated on the hole transport layer to produce the full device.

FIG. 1 shows scanning electron microscopy images revealing drastic differences between the (FA$_{0.85}$MA$_{0.15}$)$_{0.95}$Pb(I$_{0.85}$Br$_{0.15}$) perovskite films with (FIG. 1a,b) and without (FIG. 1c,d) vacuum-flash treatment. The top view of a film prepared by the conventional single step solution deposition (conventional process, CP) shows that the mesoporous TiO$_2$ is not fully covered by the perovskite. Big pigment grains form islands surrounded by numerous pinholes apparently due to film de-wetting during the formation of perovskite. By contrast the VASP method yields homogeneous films without pinholes, the TiO$_2$ being fully covered by the perovskite grains, their size being between 400 nm and 1000 nm. The cross-sectional SEM images confirm the stark difference in morphology difference between films subjected or not to VASP. Without VASP treatment, a large fraction of the TiO$_2$ remains exposed and the other part is covered. If VASP is applied the perovskite is well infiltrated into the mesoporous TiO$_2$ film forming a continuous TiO$_2$/perovskite nano-composite, which is covered by a ~400 nm thick compact capping layer. The size of most of the perovskite crystallites in the capping layer is commensurate with its thickness. Hence very few grain boundaries are visible across the capping layer. This should reduce radiation-less charge carrier recombination, which is likely to occur on trapping sites associated with grain boundaries.

In order to further scrutinize the uniformity of the VASP-based (FA$_{0.85}$MA$_{0.15}$)$_{0.95}$Pb((I$_{0.85}$Br$_{0.15}$))$_{2.9}$ perovskite film over large area, we used atomic force microscope (AFM) to measure the surface roughness of 9 spots each 10×10 micrometer sized and distributed over a film surface of square-inch. All of these areas show about the same surface roughness of 30±5 nm. The apparent grain size observed in the AFM image is consistent with that seen in the SEM in FIG. 1a.

Figure 3:
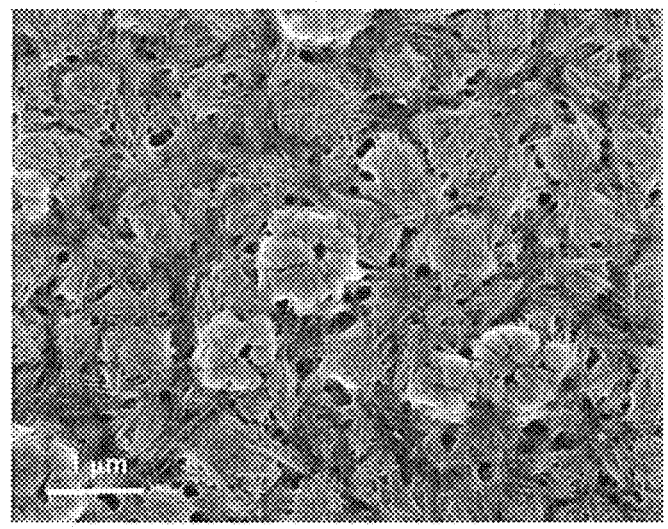
FIG. 3 shows SEM images of the surface the perovskite films freshly deposited on the mesoporousp-TiO$_2$/FTO substrates after VASP treatment before thermal annealing.

The SEM top view of the freshly vacuum-flash treated film (FIG. 3) holds vital clues about the formation of the perovskite from spin-coated $(FA_{0.85}MA_{0.15})_{0.95}Pb((I_{0.85}Br_{0.15}))_{2.9}$ precursor films. The image reveals the presence of particles consisting of agglomerated nanofibers. The nanofibers are likely intermediates between the precursor solution and the perovskite. The bundled fibers form a network with bright spots at their edge, which may be attributed to crystal nuclei. Abundance of crystal nuclei would help to produce a homogeneous film by preventing de-wetting. These can grow in the vertical direction during the annealing, which agrees well with the cross sectional SEM image of the vacuum treated perovskite film. Besides the nanofibers, few bright particles are observed which probably present perovskite grains. During the annealing, the grains can, grow into larger perovskite grains by Ostwald ripening.

Following spin coating, residual solvent remains with the perovskite precursor forming a metastable film. Annealing the film above its glass transition temperature increases the mobility of the perovskite precursor leading to de-wetting. This undesirable de-wetting process is prevented by the VASP treatment, as the flash evaporation of the solvent augments the viscosity and glass transition temperature of the spin coated film and produces a burst of nuclei for growing the perovskite gains.

Figure 2:
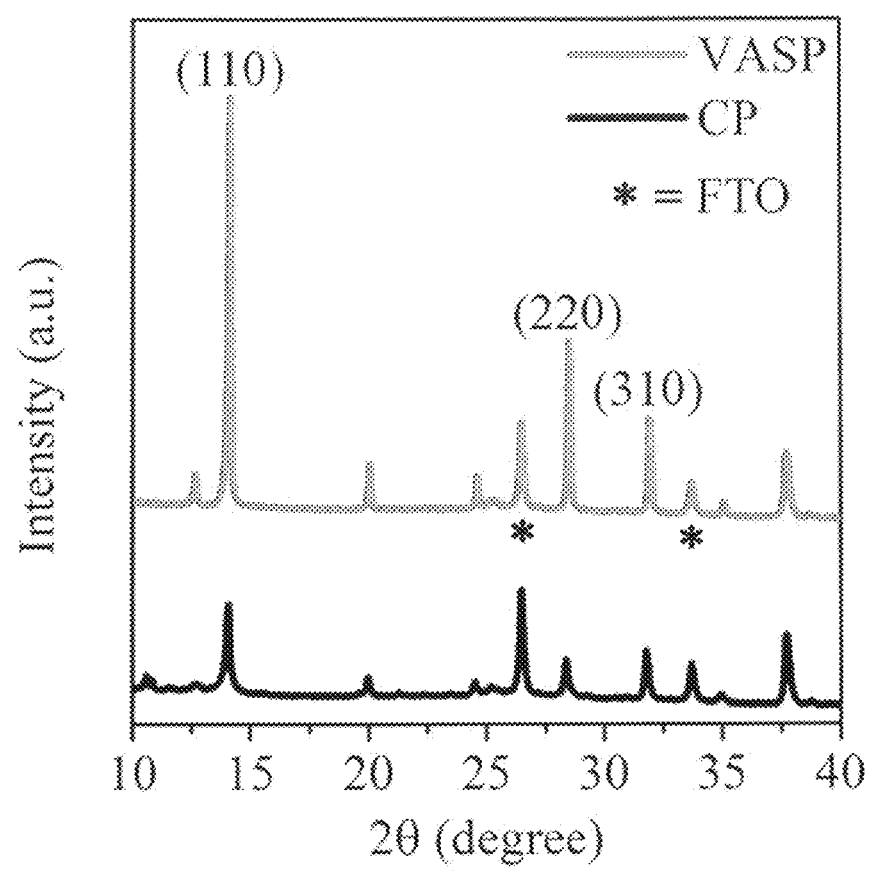
FIG. 2 shows XRD graphics of the perovskite films with and without VASP treatment as shown in FIG. 1.

FIG. 2 shows the XRD spectra of the $(FA_{0.85}MA_{0.15})_{0.95}Pb(I_{0.85}Br_{0.15})$ perovskite films. The relative intensity between the perovskite peak at 2q=14.15° and FTO at 2q=37.73° of the vacuum treated film (4.87) is significantly higher than that of the film without vacuum treatment (3.05). This is attributed to the contiguous and compact character of the perovskite capping layer formed by the VASP method shielding the FTO. VASP also improves the crystallinity of the film, which contributes to the observed increase in the peak ratio. From the XRD spectra we infer that vacuum flash treatment also affects the crystal orientation. Thus, the relative intensity of the peaks at and 14.15 degree corresponding to (−111) planes[5] and 20.05 degree corresponding to (120) planes[36] for the vacuum treated and non-vacuum treated of films are 6.2 and 4.0, respectively. The line broadening at half maximum intensity (FWHM) for the vacuum treated film is smaller than that of the film without vacuum treatment at the same angle. For example, the FWHM for the vacuum and non-vacuum treated films at 14.15 degree are 0.13 degree and 0.156 degree; and the FWHM at 28.5 degree are 0.156 degree and 0.208 degree, respectively. It indicates the mean size of perovskite crystallites of the vacuum treated film is larger than that of the film without vacuum treatment.

Figure 4:
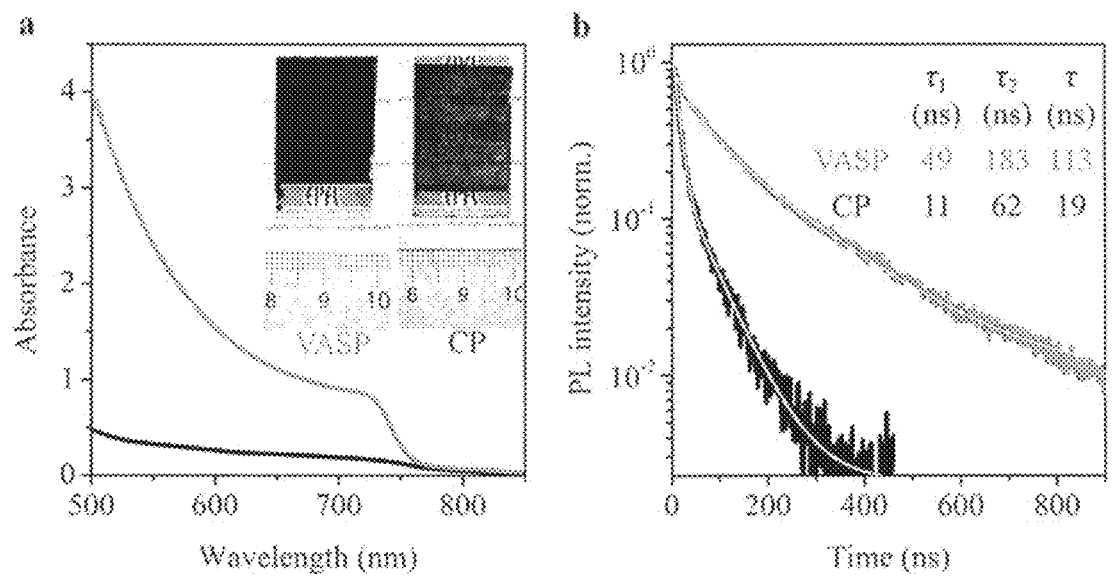
FIG. 4 shows UV-vis and photoluminescence (PL) measurement of untreated (black trace (curve, bottom trace/curve) and VASP treated perovskite films (red colored trace/curve or top trace/curve).

FIG. 4 shows UV-vis absorption and emission spectra for the perovskite films. The flash vacuum treated perovskite films shows higher absorbance than the reference owing to better homogeneity. Fluorescence measurement indicates also a more intense emission for the vacuum treated film. The time-resolved photoluminescence FIG. 4b shows that the vacuum treated film has a significantly longer fluorescence lifetime than the untreated reference. A longer photoluminescence lifetime implies less non-radiative decay, which in turn increases the photo-voltage in good agreement with the photovoltaic, results.

Figure 5:
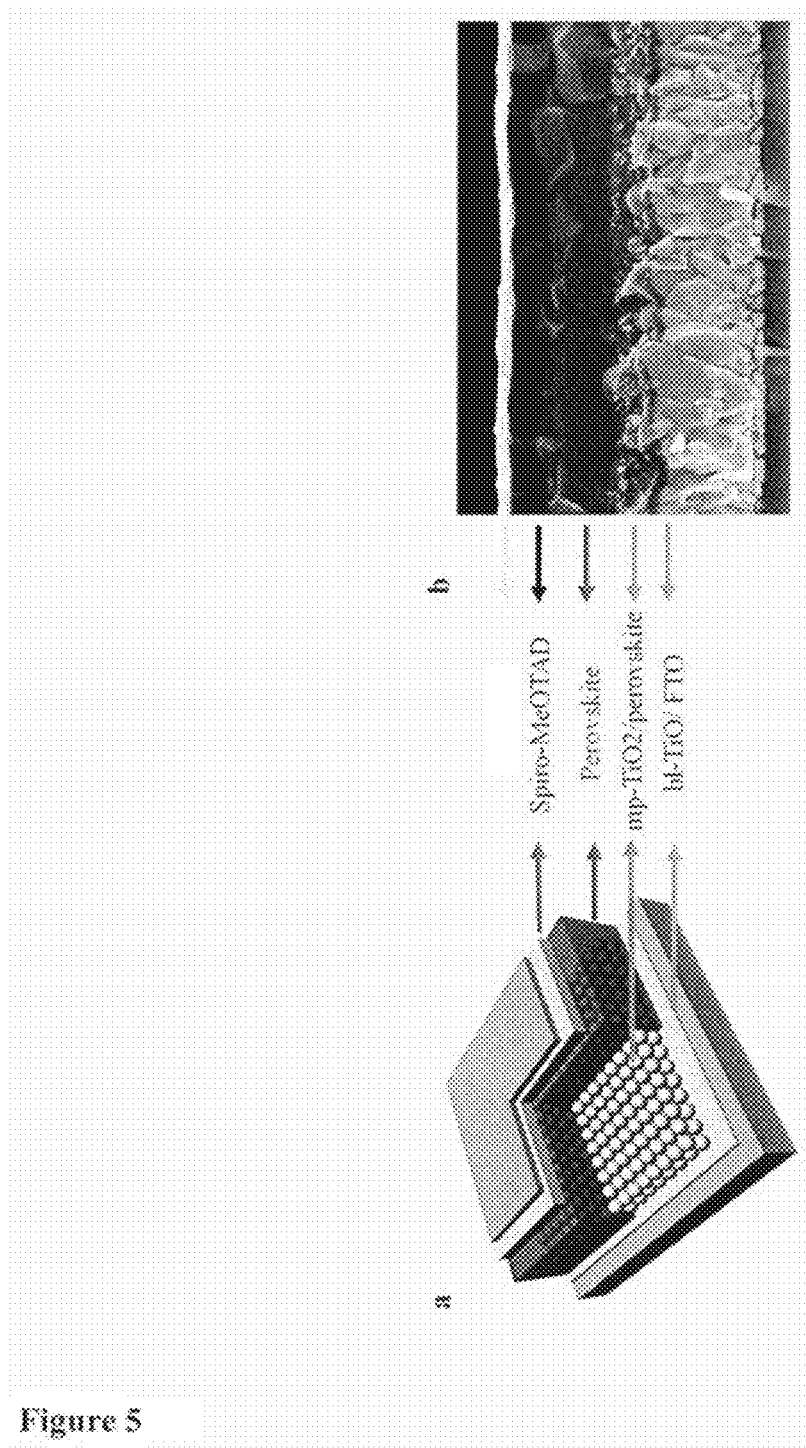
FIG. 5 shows the structure of a photovoltaic device according to the method of the invention.

Mesoscopic PSCs of the architecture fabricated by the method of the invention are shown in FIG. 5, and comprise perovskite thin films of the composition $(FA_{0.85}MA_{0.15})_{0.95}Pb(I_{0.85}Br_{0.15})$ as light harvesters (sensitizer). We evaluated the photovoltaic metrics of the devices by measuring their photocurrent density vs. voltage (J-V) curves and their incident-photon-to-current conversion efficiency (IPCE), and tested their stabilized maximum output. We covered the devices by a black mask with an aperture area of 1.0×1.0 $cm^2$.

TABLE 1

Photovoltaic parameters of a batch of twenty $[FAI_{0.81}(PbI_2)_{0.85}(MAPbBr_3)_{0.15}]$ based perovskite devices fabricated by conventional process (CP) measured with an aperture area of 1.00 $cm^2$ under standard AM 1.5G (air mass 1.5 global) illumination.

| Cell No. | $V_{OC}$(mV) | $J_{SC}$ (mA/$cm^{-2}$) | FF | Light Intensity (mW/$cm^2$) | PCE (%) |
| --- | --- | --- | --- | --- | --- |
| 1 | 950 | 17.29 | 0.6 | 98.0 | 9.96 |
| 2 | 927 | 17.12 | 0.57 | 97.0 | 9.32 |
| 3 | 959 | 17.67 | 0.59 | 98.3 | 10.23 |
| 4 | 940 | 16.91 | 0.62 | 96.5 | 10.17 |
| 5 | 957 | 17.42 | 0.61 | 96.4 | 10.59 |
| 6 | 912 | 17.01 | 0.53 | 96.6 | 8.43 |
| 7 | 934 | 16.86 | 0.60 | 96.1 | 9.85 |
| 8 | 945 | 16.31 | 0.60 | 96.0 | 9.56 |
| 9 | 968 | 16.47 | 0.57 | 95.9 | 8.36 |
| 10 | 946 | 17.92 | 0.56 | 97.3 | 9.82 |
| 11 | 932 | 17.31 | 0.50 | 95.9 | 8.39 |
| 12 | 936 | 17.73 | 0.56 | 96.8 | 9.57 |
| 13 | 921 | 17.75 | 0.58 | 95.7 | 9.87 |
| 14 | 929 | 17.22 | 0.55 | 97.0 | 9.04 |
| 15 | 908 | 17.76 | 0.59 | 96.8 | 9.77 |
| 16 | 949 | 18.13 | 0.61 | 97.1 | 10.79 |
| 17 | 932 | 17.21 | 0.58 | 97.5 | 9.54 |
| 18 | 946 | 17.01 | 0.61 | 97.0 | 10.12 |
| 19 | 936 | 17.21 | 0.56 | 96.5 | 9.35 |
| 20 | 939 | 16.61 | 0.60 | 96.0 | 9.75 |
| Average | 938 ± 15 | 17.25 ± 0.49 | 0.58 ± 0.03 | 96.70 ± 0.70 | 9.62 ± 0.67 |

TABLE 2

Photovoltaic parameters of a batch of twenty $[FAI_{0.81}(PbI_2)_{0.85}(MAPbBr_3)_{0.15}]$ based perovskite devices fabricated by vacuum assisted solution process (VASP) measured with an aperture area of 1.00 $cm^2$ under standard AM 1.5G (air mass 1.5 global) illumination.

| Cell No. | $V_{OC}$(mV) | $J_{SC}$ (mA $cm^{-2}$) | FF | Light Intensity (mW/$cm^2$) | PCE (%) |
| --- | --- | --- | --- | --- | --- |
| 1 | 1132 | 23.78 | 0.75 | 99.4 | 20.28 |
| 2 | 1129 | 23.53 | 0.72 | 97.7 | 19.66 |
| 3 | 1135 | 22.97 | 0.75 | 98.8 | 19.71 |
| 4 | 1135 | 22.83 | 0.74 | 99.0 | 19.37 |
| 5 | 1137 | 22.54 | 0.74 | 98.7 | 19.29 |
| 6 | 1122 | 23.21 | 0.73 | 97.9 | 19.42 |
| 7 | 1130 | 23.03 | 0.74 | 98.8 | 19.36 |
| 8 | 1123 | 23.13 | 0.73 | 98.1 | 19.46 |
| 9 | 1126 | 22.98 | 0.74 | 98.1 | 19.44 |
| 10 | 1116 | 22.88 | 0.73 | 97.9 | 18.99 |
| 11 | 1121 | 23.36 | 0.72 | 98.0 | 19.15 |
| 12 | 1132 | 22.76 | 0.74 | 97.8 | 19.44 |
| 13 | 1131 | 23.31 | 0.72 | 98.0 | 19.39 |
| 14 | 1141 | 23.19 | 0.76 | 98.3 | 20.38 |
| 15 | 1140 | 23.45 | 0.74 | 98.2 | 20.23 |
| 16 | 1126 | 23.15 | 0.73 | 98.4 | 19.37 |
| 17 | 1114 | 23.02 | 0.74 | 97.2 | 19.50 |
| 18 | 1138 | 23.03 | 0.75 | 98.4 | 19.95 |
| 19 | 1132 | 23.24 | 0.74 | 98.6 | 19.64 |
| 20 | 1133 | 23.04 | 0.74 | 98.0 | 19.58 |
| Average | 1130 ± 8 | 23.12 ± 0.28 | 0.74 ± 0.01 | 98.3 ± 0.5 | 19.58 ± 0.37 |

Tables 1 and 2 provide statistical data on the PV metrics of the PSCs.

Figure 6:
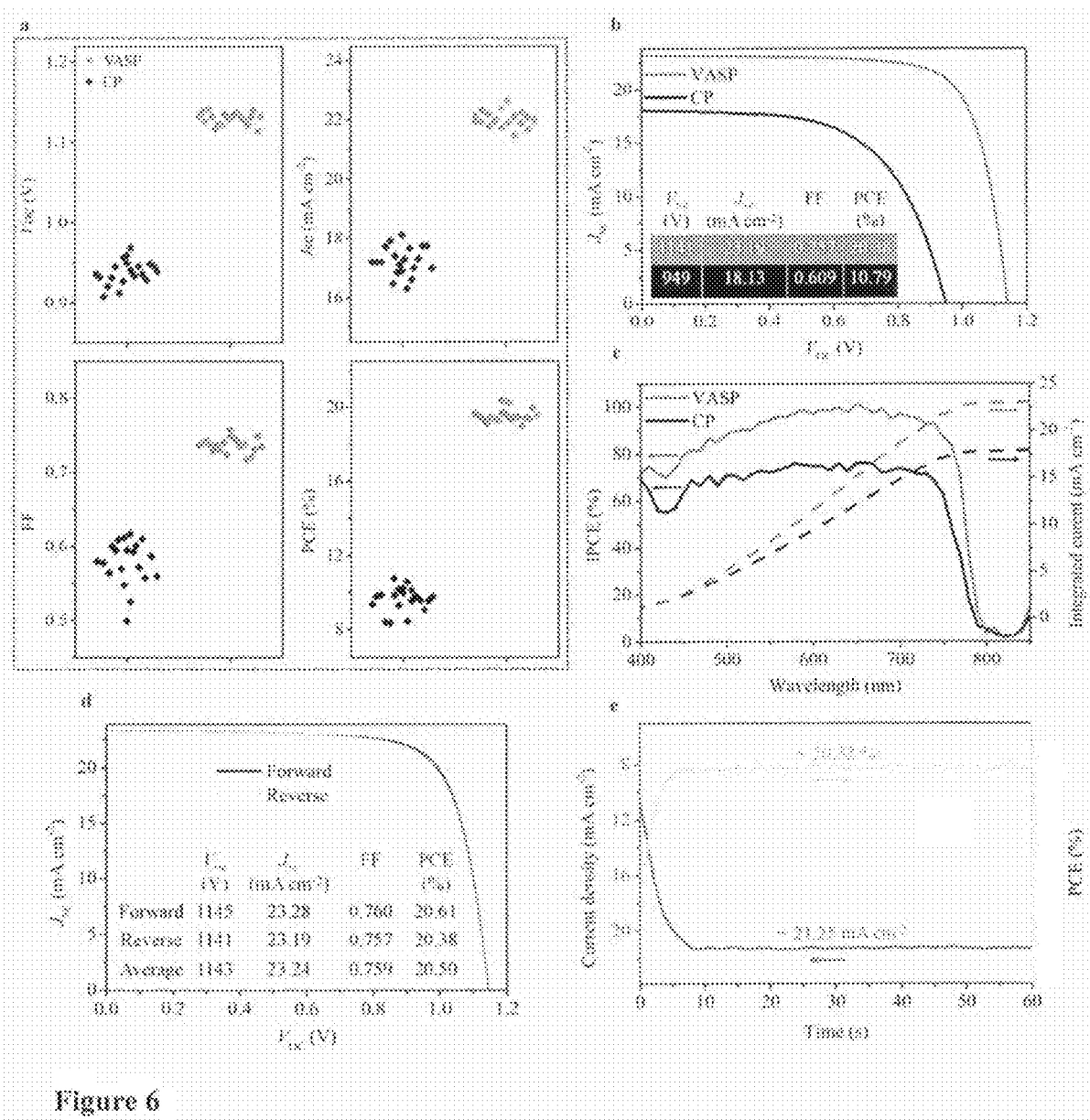
FIG. 6 shows photovoltaic characterization.

As shown in FIG. 6a, the VASP vastly improved device performance and reproducibility compared to the CP method. The average PCE for twenty PSCs obtained via the CP method was 9.62±0.67% with short circuit photocurrent density ($J_{sc}$) of 17.25±0.49 mA cm$^{-2}$, open circuit voltage ($V_{oc}$) of 938±15 mV, and fill factor (FF) of 0.578±0.030. The average PCE more than doubled to 19.58±0.37% using the VASP method with $J_{sc}$ of 23.12±0.28 mA cm$^{-2}$, $V_{oc}$ of 1130±8 mV and FF of 0.737±0.010. Photo-current density versus voltage (current-voltage) curves are shown for the best cells in FIG. 6b. The substantial performance improvement produced by the VASP procedure is reflected in the values for all the photovoltaic metrics. The best cell produced by the standard CP procedure gave a PEC of 10.79% resulting from a $J_{SC}$ of 15.6 mA cm$^{-2}$, a $V_{OC}$ of 949 mV, and a FF of 0.609. By contrast, the perovskite film grown by applying the VASP method showed a superior $J_{SC}$ of 23.19 mA cm$^{-2}$, a $V_{OC}$ of 1141 mV, and a FF of 0.757, reaching a PCE of 20% under standard AM1.5 solar illumination. FIG. 6c shows the incident photon-to-current conversion efficiency (IPCE) over the spectral range between 400 nm to 800 nm. The VASP technology achieved much higher IPCE than CP method, matching the difference in device photocurrents obtained from these two procedures.

We examined the hysteresis of our cells using different scan directions, as displayed in FIG. 6d. The difference between the forward scan and reverse scan is negligible, indicating that the perovskite film morphology controlled by the VASP method helps to create robust low impedance interfaces that can, mitigate the J-V hysteresis under routine scanning condition. To further verify the performance of the PSCs, their stabilized power output was monitored over time near the maximum power point. FIG. 6e shows that a 20.32% stabilized PCE output with a photocurrent density of 21.25 mA cm$^{-2}$ was achieved for the same large-area device in FIG. 3d, which is in good agreement with the scanned J-V test. We attribute this high efficiency level for >1 cm$^2$ area PSC to the high crystallinity and uniformity at multiple length scales of the perovskite thin films prepared by VASP. One of our 1.0×1.0 cm$^2$ device was tested by Newport Corporation PV Lab, Bozeman, USA, which shows a certified PCE of 19.6%, with $J_{sc}$ of 22.6 mA cm$^{-2}$, $V_{oc}$ of 1143 mV and a FF of 75.7%.

Figure 7:
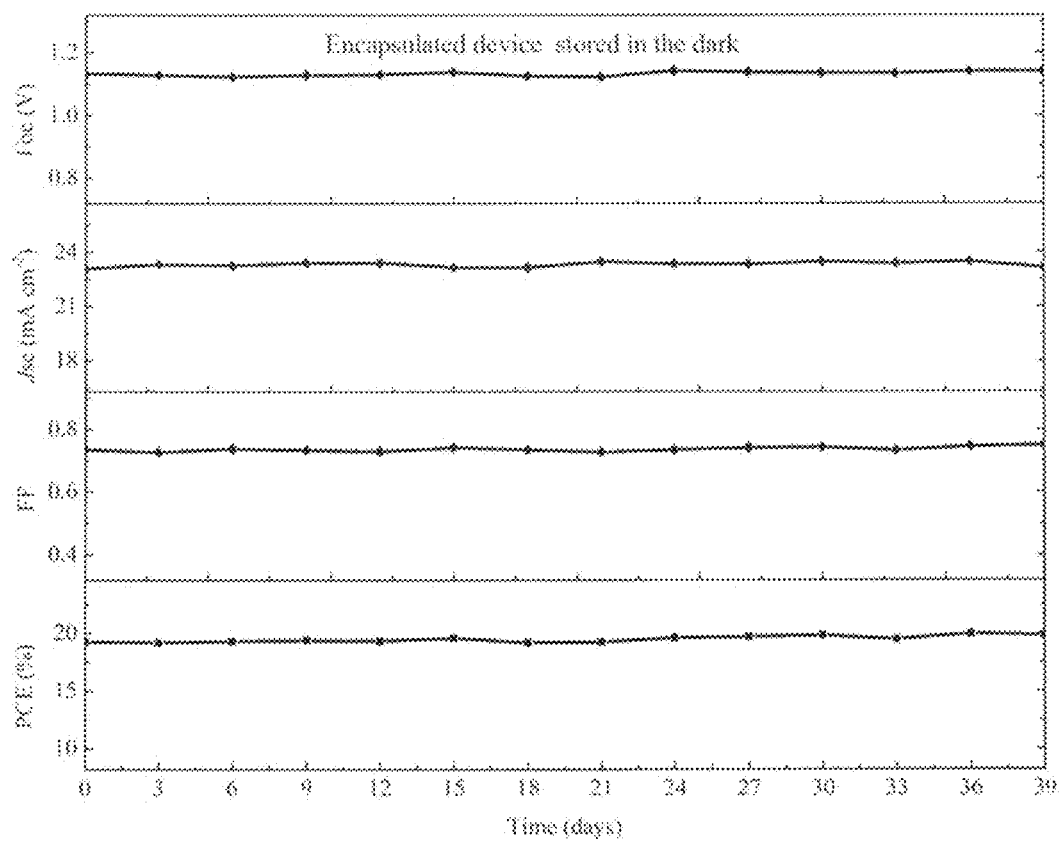
FIG. 7 shows the organic-inorganic perovskite based photovoltaic device stability in ambient air.

A preliminary stability investigation shows that the devices are relatively stable and the final PCE increased slightly during 39 days (FIG. 7). The evolution of the device performance parameters during ageing in the dark at ambient temperature was recorded. The laminated devices were kept in ambient air for 39 days. PV performance metrics were measured at regular intervals of 3 days employing simulated full solar AM 1.5 light at room temperature.

Moreover, this method is versatile with respect to variations of precursor components and perovskite compositions. As a demonstration we tested it with the recent emerging perovskite material $Cs_xFA_{(1-x)}PbX_3$. We obtained an excellent PCE of close to 18% in the initial trial, the detailed photovoltaic parameters were listed in Table 3.

TABLE 3

Photovoltaic parameters of a batch of ten [FAI]$_{0.81}$(PbI$_2$)$_{0.85}$(CsPbBr$_3$)$_{0.15}$] based perovskite devices with an active area of 0.6 × 0.6 cm$^2$ fabricated by vacuum assisted solution process (VASP) measured with an aperture area of 0.4 × 0.4 cm$^2$ under standard AM 1.5G (air mass 1.5 global) illumination.

| Cell No. | $V_{OC}$(mV) | $J_{SC}$ (mA cm$^{-2}$) | FF | Light Intensity (mW/cm$^2$) | PCE (%) |
|---|---|---|---|---|---|
| 1 | 1.13 | 21.28 | 0.70 | 97.4 | 17.24 |
| 2 | 1.12 | 19.19 | 0.75 | 96.6 | 16.63 |
| 3 | 1.11 | 20.51 | 0.68 | 97.1 | 15.96 |
| 4 | 1.12 | 20.58 | 0.71 | 96.9 | 16.92 |
| 5 | 1.14 | 21.22 | 0.72 | 96.6 | 18.08 |
| 6 | 1.12 | 20.84 | 0.71 | 96.6 | 17.33 |
| 7 | 1.12 | 20.77 | 0.71 | 97.7 | 17.01 |
| 8 | 1.13 | 20.96 | 0.73 | 97.1 | 17.66 |
| 9 | 1.13 | 21.07 | 0.70 | 96.8 | 17.07 |
| 10 | 1.12 | 20.40 | 0.67 | 97.0 | 15.79 |

In summary, we reported a vacuum assisted solution process for producing high quality perovskite films for high efficiency large area perovskite solar cells. It can easily be implemented and scaled-up for industrial application.

The invention claimed is:

1. A method for producing a solid state solar cell comprising the steps of:

providing a conductive support layer or current collector;

applying a metal oxide layer, which may form a scaffold structure on the conductive support layer, wherein the metal oxide layer comprises a metal oxide selected from $TiO_2$, $SnO_2$, $Fe_2O_3$, $ZnO$, $WO_3$, $Nb_2O_5$, and $SrTiO_3$;

providing one sensitizer layer comprising an organic-inorganic perovskite or a metal halide perovskite onto the metal oxide layer according to any one of perovskite-structures of formulae (I), (Ia), (Ib), (Ic), (Id), (Ie), (If) and/or (Ig) below:

$AA'MX_4$ (I)

$AMX_3$ (Ia)

$AA'N_{2/3}X_4$ (Ib)

$AN_{2/3}X_3$ (Ic)

$BN_{2/3}X_4$ (Id)

$BMX_4$ (Ie)

$AA'A_1MX_3$ (If)

$AA_1MX_3$ (Ig)

wherein,

A and A' are organic, monovalent cations being independently selected from primary, secondary, tertiary or quaternary organic ammonium compounds, including N-containing heterorings and ring systems, A and A' having independently from 1 to 60 carbons and 1 to 20 heteroatoms;

$A_1$ is an inorganic cation selected from Cs$^+$, Rb$^+$, K$^+$;

B is an organic, bivalent cation selected from primary, secondary, tertiary or quaternary organic ammonium compounds having from 1 to 60 carbons and 2-20 heteroatoms and having two positively charged nitrogen atoms;

M is selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$, $[Sn_iPb_{(1-i)}]^+$, $[Sn_jGe_{(1-j)}]^+$, and $[Pb_kGe_{(1-k)}]^+$, i, j and k being a number between 0.0 and 1.0;

N is selected from the group of $Bi^{3+}$ and $Sb^{3+}$; and,

X are independently selected from $Cl^-$, $Br^-$, $I^-$, $NCS^-$, $CN^-$, $NCO^-$, from $[I_{(3-m)}Cl_m]^-$, $[I_{(3-n)}Br_n]^-$, $[Br_{(3-u)}Cl_u]^-$, m, n u being a number between 0.0 and 3.0, and from a combination of two anions selected from $Cl^-$, $Br^-$, $I^-$, the providing the one sensitizer layer onto the metal oxide layer comprising the following separate successive steps:

- a step of depositing an organic-inorganic perovskite film or a metal halide perovskite film in form of a solution of one perovskite precursor or one perovskite precursor with mixed cations and anions in a solvent onto a preceding layer, said film being metastable and said solution of the one perovskite precursor or the one perovskite precursor with mixed cations and anions consisting substantially of an organic-inorganic perovskite or a metal halide perovskite according to any one perovskite-structures of formulae (I), (Ia), (Ib), (Ic), (Id), (Ie), (If) and/or (Ig) dissolved in the solvent;
- a step of applying a vacuum-flash treatment to the metastable organic-inorganic perovskite film or metastable metal halide perovskite film deposited onto said preceding layer before annealing the sensitizer layer, said step of applying a vacuum-flash treatment consisting of flash evaporation of the solvent; and
- a step of annealing the vacuum-flash treated organic-inorganic perovskite film or metal halide perovskite film; and providing a counter electrode or a metal electrode onto the sensitizer layer.

2. The method of claim 1 further comprising applying a first layer comprising a charge transporting layer onto the metal oxide layer before applying the sensitizer layer, said first layer being covered by the sensitizer layer and being the preceding layer onto which the organic-inorganic perovskite film or metal halide perovskite film is deposited.

3. The method of claim 1, wherein a second layer is applied onto the sensitizer layer, said second layer being selected from a charge transporting layer, a protective layer, or a combination of both layers, and the counter electrode or the metal electrode covering said second layer.

4. The method of claim 1, wherein the step of depositing the organic-inorganic perovskite film or the metal halide perovskite film in form of the solution of the one perovskite precursor or the one perovskite precursor with the mixed cations and anions in the solvent, said solution consisting of an organic-inorganic perovskite or a metal halide perovskite according to any one perovskite-structures of formulae (I), (Ia), (Ib), (Ic), (Id), (Ie), (If) and/or (Ig) dissolved in a solvent is performed by a deposition method selected from drop casting, spin-coating, dip-coating, spray-coating and a combination of said deposition methods.

5. The method of claim 1, wherein the pressure of the vacuum is in the range from 1 to 20 Pa.

6. The method of claim 1, wherein the step of applying the vacuum is a flash evaporation step and lasts from 1 to 20 seconds.

7. The method of claim 3, wherein the second layer is a charge transporting layer comprising a hole transport material.

* * * * *